(12) United States Patent
Young et al.

(10) Patent No.: US 11,903,189 B2
(45) Date of Patent: Feb. 13, 2024

(54) THREE-DIMENSIONAL MEMORY AND FABRICATING METHOD THEREOF

(71) Applicant: Taiwan Semiconductor Manufacturing Co., Ltd., Hsinchu (TW)

(72) Inventors: Bo-Feng Young, Taipei (TW); Sai-Hooi Yeong, Zhubei (TW); Chih-Yu Chang, New Taipei (TW); Han-Jong Chia, Hsinchu (TW); Chenchen Jacob Wang, Hsinchu (TW); Yu-Ming Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 472 days.

(21) Appl. No.: 16/924,903

(22) Filed: Jul. 9, 2020

(65) Prior Publication Data

US 2022/0013532 A1   Jan. 13, 2022

(51) Int. Cl.
| | |
|---|---|
| *H10B 41/27* | (2023.01) |
| *H01L 29/06* | (2006.01) |
| *H01L 29/423* | (2006.01) |
| *H10B 41/30* | (2023.01) |
| *G11C 16/24* | (2006.01) |
| *G11C 16/08* | (2006.01) |

(52) U.S. Cl.
CPC ............ *H10B 41/27* (2023.02); *G11C 16/08* (2013.01); *G11C 16/24* (2013.01); *H01L 29/0669* (2013.01); *H01L 29/42392* (2013.01); *H10B 41/30* (2023.02)

(58) Field of Classification Search
None
See application file for complete search history.

(56) References Cited

U.S. PATENT DOCUMENTS

| | | | |
|---|---|---|---|
| 9,209,247 B2 | 12/2015 | Colinge et al. | |
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |

(Continued)

*Primary Examiner* — Xiaoming Liu
(74) *Attorney, Agent, or Firm* — Birch, Stewart, Kolasch & Birch, LLP

(57) ABSTRACT

Three-dimensional memories are provided. A three-dimensional memory includes a plurality of memory cells, a plurality of word lines, a plurality of bit lines and a plurality of source lines. The memory cells are divided into a plurality of groups, and the groups of memory cells are formed in respective levels stacked along a first direction. The word lines extend along a second direction, and the second direction is perpendicular to the first direction. Each of the bit lines includes a plurality of sub-bit lines formed in the respective levels. Each of the source lines includes a plurality of sub-source lines formed in respective levels. In each of the levels, the memory cells of the corresponding group are arranged in a plurality of columns, and the sub-bit lines and the sub-source lines are alternately arranged between two adjacent columns.

20 Claims, 11 Drawing Sheets

(56) References Cited

U.S. PATENT DOCUMENTS

| | | |
|---|---|---|
| 9,608,116 B2 | 3/2017 | Ching et al. |
| 2018/0151452 A1* | 5/2018 | Doornbos ............ H01L 29/0673 |
| 2021/0036020 A1* | 2/2021 | Park ....................... H10B 51/30 |
| 2021/0091108 A1* | 3/2021 | Naruke ............... H01L 23/5226 |

* cited by examiner

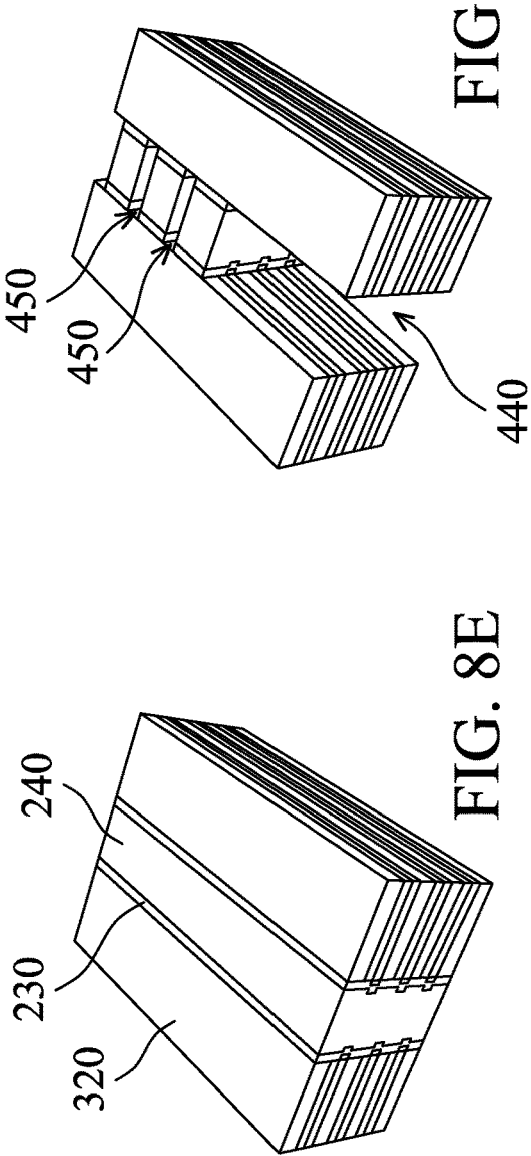
FIG. 8E
FIG. 8F
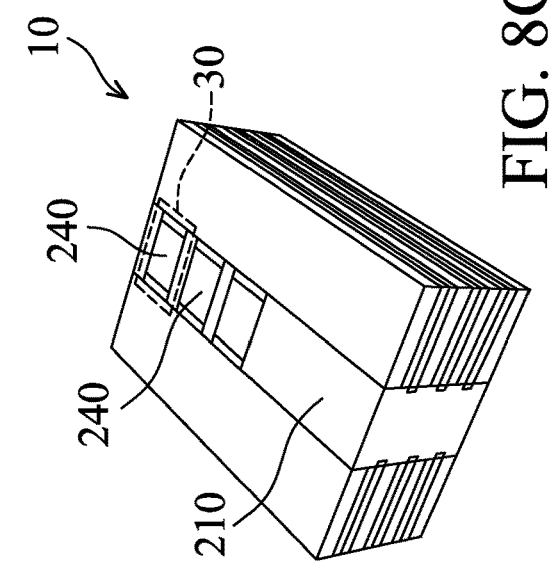
FIG. 8G
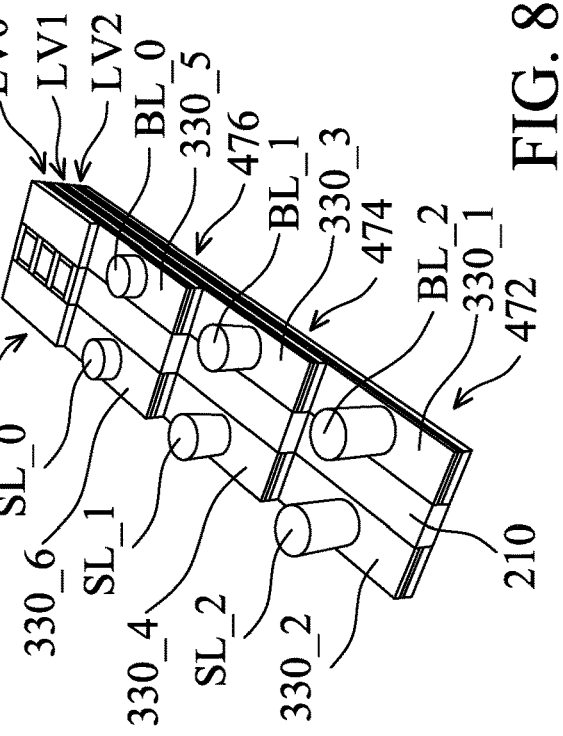
FIG. 8H

THREE-DIMENSIONAL MEMORY AND FABRICATING METHOD THEREOF

BACKGROUND

A recent trend in semiconductor memories is to fabricate three-dimensional (3D) integrated circuits (3D IC). 3D ICs include a variety of structures, such as die on silicon interposer, stacked dies, multi-tiered, stacked CMOS structures, or the like. These 3D circuits offer a host of advantages over traditional two dimensional circuits: lower power consumption, higher memory cell density, greater efficiency, alleviating bottlenecks, shorter critical path delays, and lower area cost to name just a few.

Shrinking the cell size and increasing density for memory is eagerly needed for various applications, e.g., embedded memory or standalone memory. Therefore, it is important to have a memory of small size and high density.

BRIEF DESCRIPTION OF THE DRAWINGS

Aspects of the present disclosure are best understood from the following detailed description when read with the accompanying figures. It should be noted that, in accordance with the standard practice in the industry, various nodes are not drawn to scale. In fact, the dimensions of the various nodes may be arbitrarily increased or reduced for clarity of discussion.

FIGS. 8A-8H illustrate the memory cell array formed by the method of FIG. 7.

DETAILED DESCRIPTION

Figure 1:
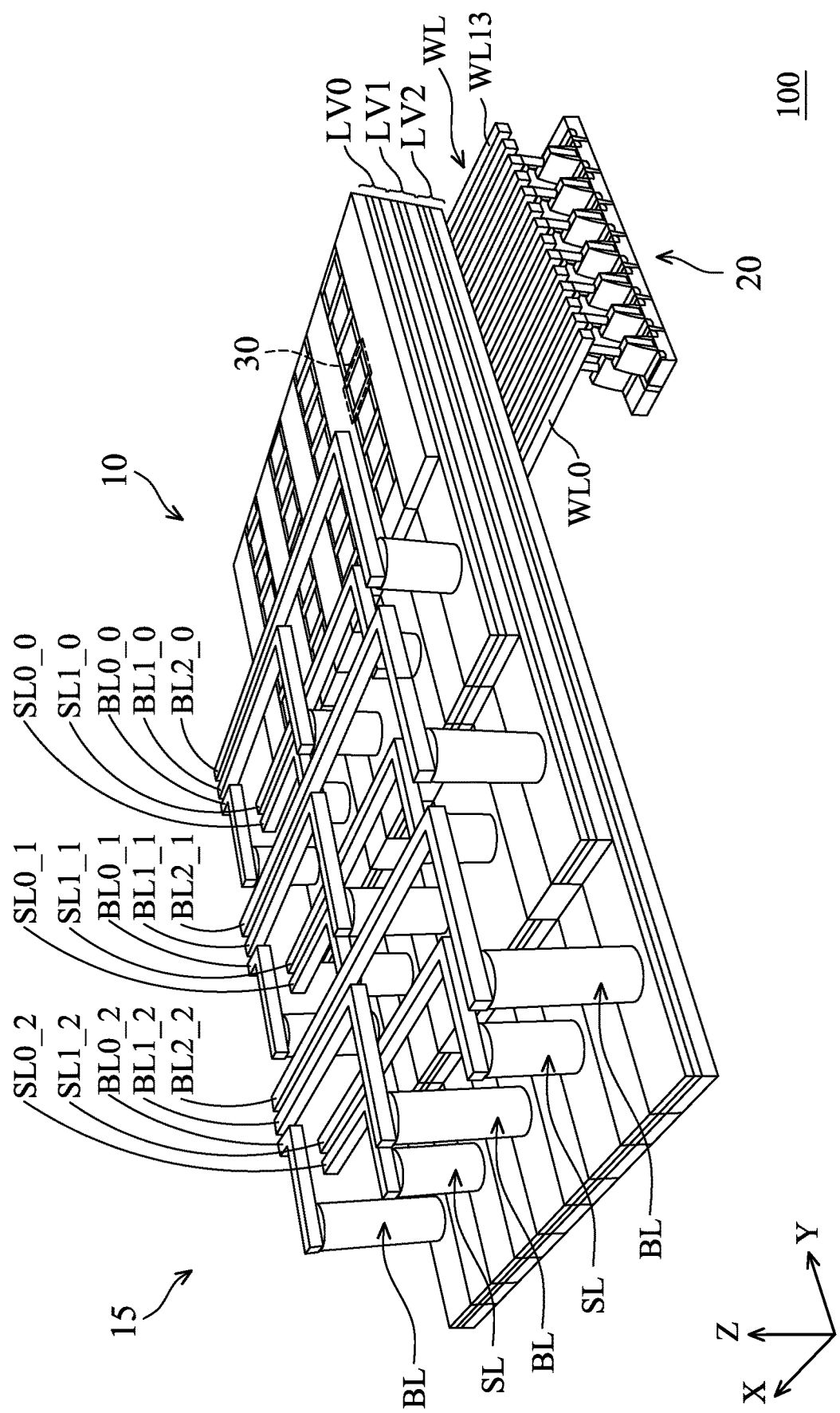
FIG. 1 shows a three-dimensional (3D) memory, in accordance with some embodiments of the disclosure.

The following disclosure provides many different embodiments, or examples, for implementing different nodes of the subject matter provided. Specific examples of components and arrangements are described below to simplify the present disclosure. These are, of course, merely examples and are not intended to be limiting. In some embodiments, the formation of a first node over or on a second node in the description that follows may include embodiments in which the first and the second nodes are formed in direct contact, and may also include embodiments in which additional nodes may be formed between the first and the second nodes, such that the first and the second nodes may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Furthermore, spatially relative terms, such as "beneath," "below," "lower," "above," "upper" and the like, may be used herein for ease of description to describe one element or feature's relationship to another element or feature as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIG. 1 shows a three-dimensional (3D) memory 100, in accordance with some embodiments of the disclosure. The three-dimensional memory 100 includes a memory cell array 10. The memory cell array 10 is multi-level (or multi-layer) structure, and the memory cell array 10 includes multiple memory cells 30 arranged in each level of the multi-level structure. Furthermore, the number of the memory cells 30 in the levels are the same. The memory cell array 10 will be described below.

The three-dimensional memory 100 further includes an interconnect structure 15, and the interconnect structure 15 is configured to provide the bit lines BL and the source lines SL to the memory cell array 10. The bit lines BL and the source lines SL are arrange to extend along Y direction, i.e., the bit lines BL are parallel to the source line SL. Furthermore, multiple bit lines BL (e.g., BL0-BLk and k=2) and multiple source lines SL (e.g., SL0-SL(k−1) and k=2) are coupled to the memory cell array 10 through the interconnect structure 15.

In FIG. 1, the bit line BL0 may include the sub-bit lines BL0_0 to BL0_2, and each of sub-bit lines BL0_0 to BL0_2 is arranged in the corresponding level, so as to couple the memory cells 30 in the corresponding level of the memory cell array 10. Similarly, the bit line BL1 may include the sub-bit lines BL1_0 to BL1_2, and each of sub-bit lines BL1_0 to BL1_2 is arranged in the corresponding level, so as to couple the memory cells 30 in the corresponding level of the memory cell array 10. Furthermore, the bit line BL2 may include the sub-bit lines BL2_0 to BL2_2, and each of sub-bit lines BL2_0 to BL2_2 is arranged in the corresponding level, so as to couple the memory cells 30 in the corresponding level of the memory cell array 10.

In the three-dimensional memory 100, assuming the memory cell array 10 includes the levels LV0, LV1 and LV2 stacked along Z direction and the Z direction is perpendicular to the Y direction. In some embodiments, the level LV1 is formed over the level LV2, and the level LV0 is formed over the level LV1. In some embodiments, the sub-bit lines BL0_0, BL1_0 and BL2_0 are arranged to couple the memory cells 30 in the level LV0 of the memory cell array 10 through the interconnect structure 15. Furthermore, the sub-bit lines BL0_1, BL1_1 and BL2_1 are arranged to couple the memory cells 30 in the level LV1 of the memory cell array 10 through the interconnect structure 15. Moreover, the sub-bit lines BL0_2, BL1_2 and BL2_2 are arranged to couple the memory cells 30 in the level LV2 of the memory cell array 10 through the interconnect structure 15.

In FIG. 1, the source line SL0 may include the sub-source lines SL0_0 and SL0_1, and each of sub-source lines SL0_0 and SL0_1 is arranged in the corresponding level, so as to couple the memory cells 30 in the corresponding level of the memory cell array 10. Similarly, the source line SL1 may include the sub-source lines SL1_0 and SL1_1, and ad each of sub-source lines SL1_0 to SL1_1 is arranged in the corresponding level, so as to couple the memory cells 30 in the corresponding level of the memory cell array 10.

In some embodiments, the sub-source lines SL0_0 and SL1_0 are arranged to couple the memory cells 30 in the level LV0 of the memory cell array 10 through the interconnect structure 15. Furthermore, the sub-source lines SL0_1 and SL1_1 are arranged to couple the memory cells 30 in the level LV1 of the memory cell array 10 through the interconnect structure 15. Moreover, the sub-source lines SL0_2 and SL1_2 are arranged to couple the memory cells 30 in the level LV2 of the memory cell array 10 through the interconnect structure 15.

The memory cells 30 of the same level in the memory cell array 10 may share the same sub-bit line or the same sub-source line. Moreover, the memory cells 30 of the different levels in the memory cell array 10 may not share the same sub-bit line and the same sub-source line.

In some embodiments, the bit lines BL (e.g., sub-bit lines BL0_0-BL0_2, BL1_0-BL1_2 and BL2_0-BL2_2) are coupled to the other circuits through the higher metal layer, and the source lines SL (e.g., sub-source lines SL0_0-SL0_2 and SL0 0-SL1_2) are coupled to the other circuits through the lower metal layer.

In some embodiments, the bit lines BL (e.g., sub-bit lines BL0_0-BL0_2, BL1_0-BL1_2 and BL2_0-BL2_2) are coupled to the other circuits through the lower metal layer, and the source lines SL (e.g., sub-source lines SL0_0-SL0_2 and SL0 0-SL1_2) are coupled to the other circuits through the higher metal layer.

In some embodiments, the bit lines BL (e.g., sub-bit lines BL0_0-BL0_2, BL1_0-BL1_2 and BL2_0-BL2_2) and the source lines BL (e.g., sub-source lines SL0_0-SL0_2 and SL0_0-SL1_2) are coupled to the other circuits through the same metal layer.

The three-dimensional memory 100 further includes multiple word lines WL0-WLn (e.g., n=13) extending along the X direction and the X direction is perpendicular to the Y direction and the Z direction. The word lines WL0-WLn are coupled between the memory cell array 10 and a word line driver (or decoder) 20, and the word lines WL0-WLn are configured to provide word line information to the memory cells of the memory cell array 10. In FIG. 1, the word lines WL0-WLn are formed in the same layer under the memory cell array 10. In some embodiments, the word lines WL0-WLn are formed in the same layer over the memory cell array 10. In some embodiments, the word lines WL0-WLn are formed in the same layer within the memory cell array 10. In some embodiments, the memory cells 30 of the different levels in the memory cell array 10 may share the same word line.

Figure 2:
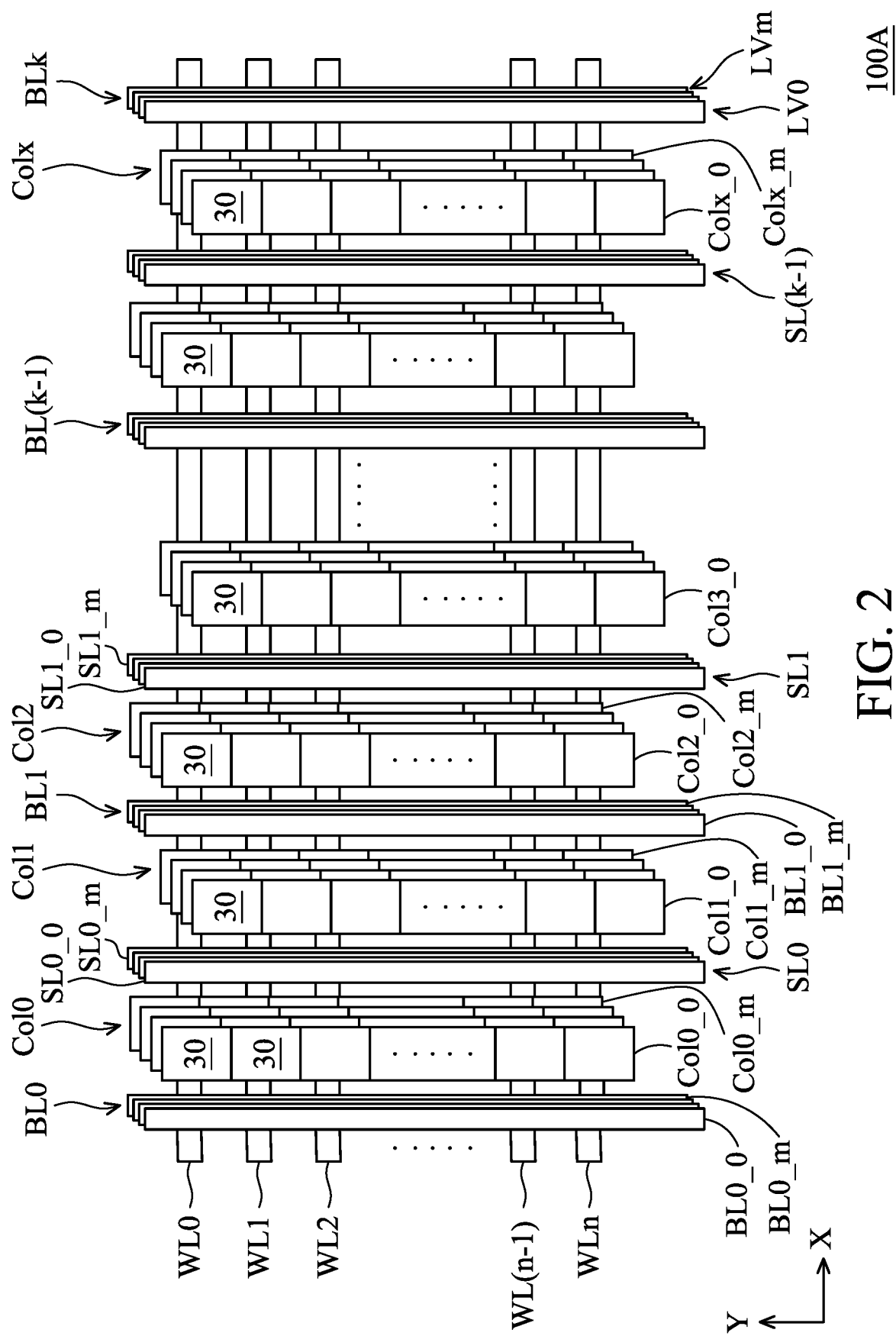
FIG. 2 shows a schematic block illustrating a three-dimensional memory, in accordance with some embodiments of the disclosure.

FIG. 2 shows a schematic block illustrating a three-dimensional memory 100A, in accordance with some embodiments of the disclosure. The three-dimensional memory 100A includes multiple word lines WL0 to WLn, multiple bit lines BL0 to BLk, multiple source lines SL0 to SL(k−1) and multiple memory cells 30. The memory cells 30 are arranged in multiple columns Col0-Colx of a memory cell array. Furthermore, the memory cell array includes multiple levels LV0 to LVm.

In the memory cell array, the memory cells 30 are divided into multiple groups, and each group of memory cells 30 is arranged in respectively level of the levels LV0 to LVm. Furthermore, the word lines WL0 to WLn extend along X direction. Furthermore, the word lines WL0 to WLn are arranged under the memory cell array. In some embodiments, the word lines WL0 to WLn are arranged over the memory cell array. In some embodiments, the word lines WL0 to WLn are arranged within the memory cell array.

Each of the bit lines BL0 to BLk include multiple sub-bit lines. For example, the bit line BL0 includes the sub-bit lines BL0_0 to BL0_m, and the bit line BL1 includes the sub-bit lines BL1_0 to BL1_m. For each of the bit lines BL0 to BLk, the number of the sub-bit lines is equal to the number of levels LV0 to LVm. Each sub-bit line corresponds one of the groups of memory cells 30. Moreover, Each sub-bit line is arranged in respectively one level of the levels LV0 to LVm. For example, the sub-bit line BL0_0 is arranged in the level LV0, and the sub-bit line BL0_m is arranged in the level LVm.

In some embodiments, the bit lines BL0 to BLk extend along Y direction. Furthermore, for each of the bit lines BL0 to BLk, the sub-bit lines are stacked along a line perpendicular to the plane formed by X direction and Y direction (e.g., Z direction of FIG. 1). For example, the sub-bit line BL0_0 is the highest line and the sub-bit line BL0_m is the lowest line in the stacked sub-bit lines of bit-line BL0.

Each of the source lines SL0 to SL(k−1) include multiple sub-bit lines. For example, the source line SL0 includes the sub-bit lines SL0_0 to SL0_m, and the source line SL1 includes the sub-source lines SL1_0 to SL1_m. For each of the source lines SL0 to SL(k−1), the number of the sub-source lines is equal to the number of levels LV0 to LVm. Each sub-source line corresponds one of the groups of memory cells 30. Moreover, Each sub-source line is arranged in respectively one level of the levels LV0 to LVm. For example, the sub-source line SL0_0 is arranged in the level LV0, and the sub-source line SL0_m is arranged in the level LVm.

In some embodiments, the source lines SL0 to SL(k−1) extend along Y direction. Furthermore, for each of the source lines SL0 to SL(k−1), the sub-bit lines are stacked along a line perpendicular to the plane formed by X direction and Y direction (e.g., Z direction of FIG. 1). For example, the sub-source line SL0_0 is the highest line and the sub-source line SL0_m is the lowest line in the stacked source-bit lines of source-line SL0.

The source lines SL0 to SL(k−1) are parallel to the bit lines BL0 to BLm. In each of the levels LV1 to LVm, the sub-source lines and the sub-bit lines are interlaced. For example, the sub-source line SL0_0 is disposed between the sub-bit lines BL0_0 and BL1_0, i.e., the sub-source line SL0_0 is surrounded by the sub-bit lines BL0_0 and BL1_0. Similarly, the sub-bit line BL1_0 is disposed between the sub-source lines SL0_0 and SL1_0, i.e., the sub-bit line BL1_0 is surrounded by the sub-source lines SL0_0 and SL1_0.

In the memory cell array of FIG. 2, the memory cells 30 are divided into multiple columns Col0 to Colx. Each of the columns Col0 to Colx includes multiple sub-columns in the levels LV0 to LVm. For example, for the column Col0, the sub-column Col0_0 is arranged in the level LV0, and the sub-column Col0_m is arranged in the level LVm. Similarly, for the column Col1, the sub-column Col1_0 is arranged in the level LV0, and the sub-column Col1_m is arranged in the level LVm. For each of the columns Col0 to Colx, the number of the sub-columns is equal to the number of levels LV0 to LVm.

In each of the levels LV0 to LVm of the memory cell array, the group of the memory cells 30 are arranged in the corresponding sub-columns of the columns Col0 to Colx. For example, in the level LV0, the memory cells 30 are arranged in the sub-columns Col0_0, Col1_0, . . . , Colx_0. Furthermore, the number of the memory cells 30 in the sub-columns of each level are the same.

In each of the levels LV0 to LVm, the sub-columns of the columns Col0 to Colx are separated by the sub-bit line or the sub-source line. For example, in the level LV0, the sub-columns Col0_0 and Col1_0 are separated by the sub-source line SL0_0, and the sub-columns Col1_0 and Col2_0 are separated by the sub-bit line BL1_0. Furthermore, in each of the levels LV0 to LVm, the sub-source line is surrounded by the two adjacent sub-columns. Similarly, the sub-bit line is surrounded by the two adjacent sub-columns.

In each of the levels LV0 to LVm, the sub-source line is shared by the memory cells of two adjacent sub-columns, and the sub-bit line is shared by the memory cells of two adjacent sub-columns. For example, in the level LV0, the sub-source line SL0_0 is shared by the memory cells in the sub-columns Col0_0 and Col1_0, and the sub-bit line BL1_0 is shared by the memory cells in the sub-columns Col1_0 and Col2_0.

In the memory cell array of FIG. 2, the columns Col0 to Colx of the memory cells 30 extend along Y direction. Furthermore, for each of the columns Col0 to Colx, the sub-columns are stacked along a line perpendicular to the plane formed by X direction and Y direction (e.g., Z direction of FIG. 1). For example, the sub-column Col0_0 is the highest column and the sub-column Col0_m is the lowest column in the stacked sub-columns of column Col0.

In each of the levels LV0 to LVm, the memory cells of odd sub-columns are aligned with each other, and the memory cells of even sub-columns are aligned with each other. In other words, the memory cells of odd sub-columns are not aligned with the memory cells of even sub-columns, i.e., the two adjacent sub-columns will not be aligned. For example, in the level LV0, the sub-column Col0_0 is the first sub-column and the sub-column Col2_0 is the third sub-column, and the sub-column Col0_0 is aligned with the sub-column Col2_0. Moreover, the sub-column Col1_0 is the second sub-column and the sub-column Col3_0 is the fourth sub-column, and the sub-column Col1_0 is aligned with the sub-column Col3_0. However, the sub-column Col1_0 is not aligned with the sub-columns Col0_0 and Col2_0.

Figure 3:
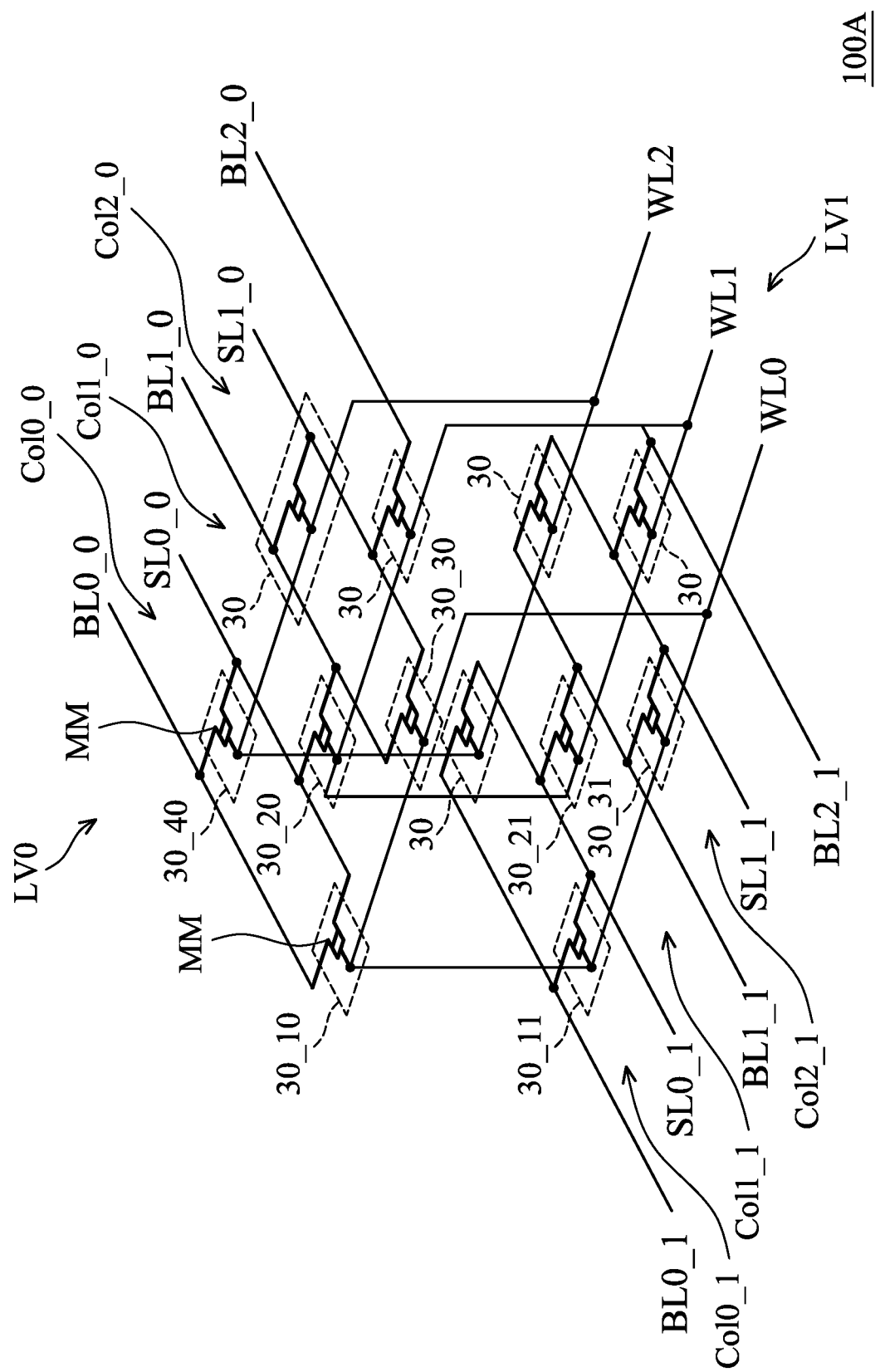
FIG. 3 shows a three-dimensional equivalent circuit illustrating the three-dimensional memory of FIG. 2, in accordance with some embodiments of the disclosure.

FIG. 3 shows a three-dimensional equivalent circuit illustrating the three-dimensional memory 100A of FIG. 2, in accordance with some embodiments of the disclosure. In order to simplify the description, only some of the memory cells 30 of the levels LV0 and LV1 are shown in FIG. 3.

In FIG. 3, the three-dimensional memory is a NOR memory which is a non-volatile storage device. In general, the NOR memory architecture provides enough address lines to map the entire memory range. This has the advantages of random access and short read times, which makes the NOR memory very suitable for code execution. Each memory cell 30 includes a single transistor MM. The transistor MM is a gate-all-around (GAA) nanowire or nanosheet transistor.

For each memory cell 30, a source of the transistor MM is coupled to the corresponding sub-source line, and a drain of the transistor MM is coupled to the corresponding sub-bit line. Furthermore, the gate of the transistor MM is coupled to the corresponding word line.

In the sub-column Col0_0 of the level LV0 in the memory cell array, the transistor MM of the memory cell 30_10 has a source coupled to the sub-source line SL0_0, a drain coupled to the sub-bit line BL0_0, and a gate coupled to the word line WL0. In the sub-column Col1_0 of the level LV0, the transistor MM of the memory cell 30_20 has a source coupled to the sub-source line SL0_0, a drain coupled to the sub-bit line BL1_0, and a gate coupled to the word line WL1. In the sub-column Col2_0 of the level LV0, the transistor MM of the memory cell 30_30 has a source coupled to the sub-source line SL1_0, a drain coupled to the sub-bit line BL1_0, and a gate coupled to the word line WL0.

In the sub-column Col0_1 of the level LV1, the transistor MM of the memory cell 30_11 has a source coupled to the sub-source line SL0_1, a drain coupled to the sub-bit line BL0_1, and a gate coupled to the word line WL0. In the sub-column Col1_1 of the level LV1, the transistor MM of the memory cell 30_21 has a source coupled to the sub-source line SL0_1, a drain coupled to the sub-bit line BL1_1, and a gate coupled to the word line WL1. In the sub-column Col2_1 of the level LV1, the transistor MM of the memory cell 30_31 has a source coupled to the sub-source line SL1_1, a drain coupled to the sub-bit line BL1_1, and a gate coupled to the word line WL0.

It should be noted that the memory cell 30_10 in the level LV0 and the memory cell 30_11 in the level LV1 share the same word line WL0. Furthermore, the memory cell 30_20 in the level LV0 and the memory cell 30_21 on the level LV1 share the same word line WL1. Moreover, the memory cell 30_30 in the level LV0 and the memory cell 30_31 in the level LV1 share the same word line WL0.

In the two adjacent sub-columns, the memory cells 30 may share the same sub-source line or the same sub-bit line. For example, in the sub-columns Col0_0 and Col1_0, the adjacent memory cells 30_10 and 30_20 share the same sub-source line SL0_0. Furthermore, in the sub-columns Col1_0 and Col2_0, the adjacent memory cells 30_20 and 30_30 share the same sub-bit line BL1_0.

In the same sub-column, the memory cells 30 are coupled to the different word lines. For example, in the sub-column Col0_0, the memory cells 30_10 and 30_40 are coupled to the word lines WL0 and WL2, respectively. Furthermore, in the different sub-columns, the memory cells 30 may couple to the same word lines. For example, in the sub-columns Col0_0 and Col2_0, the memory cells 30_10 and 30_30 are coupled to the same word line WL0.

Figure 4:
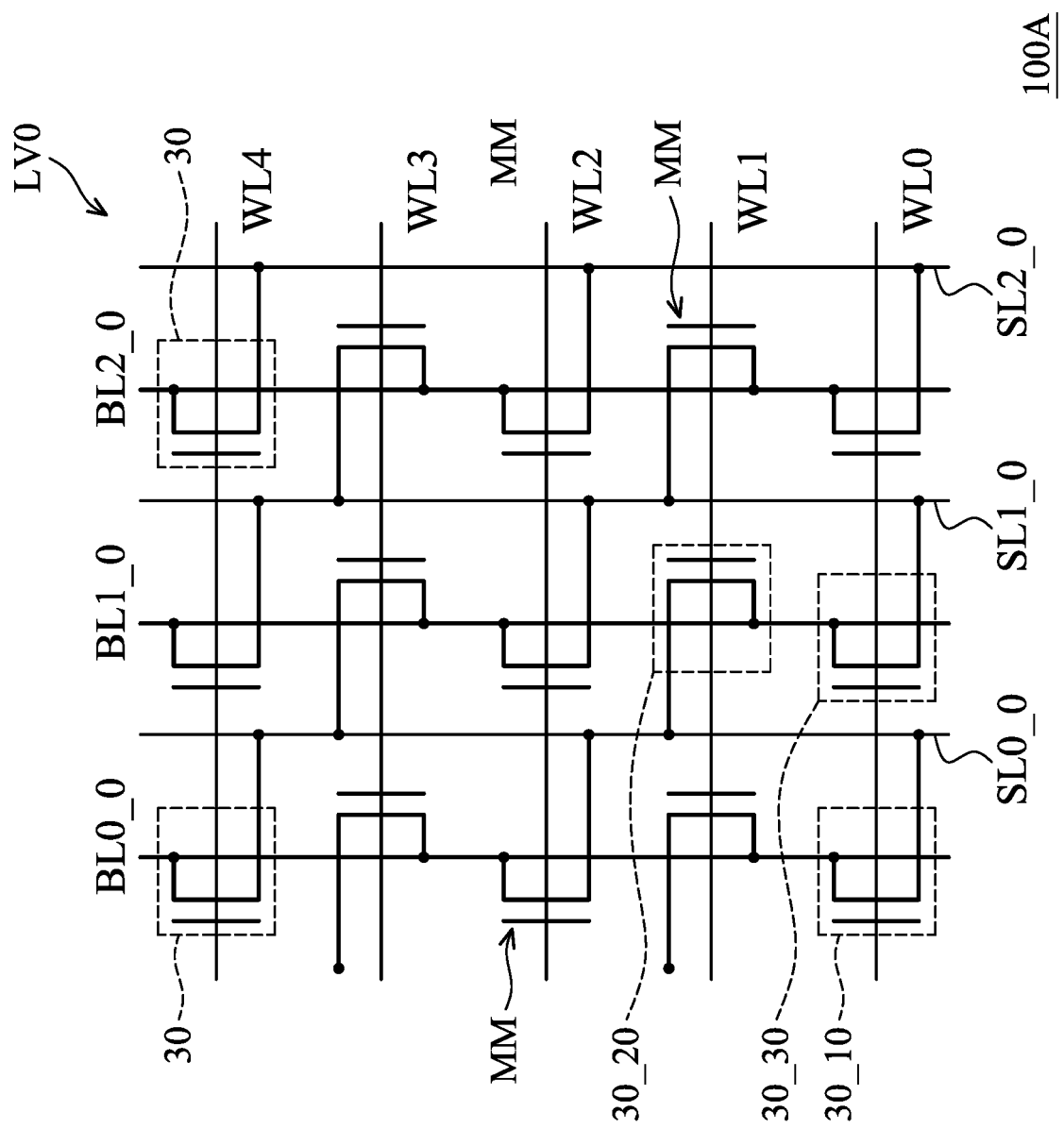
FIG. 4 shows a two-dimensional (2D) equivalent circuit illustrating the three-dimensional memory of FIG. 2, in accordance with some embodiments of the disclosure.

FIG. 4 shows a two-dimensional (2D) equivalent circuit illustrating the three-dimensional memory 100A of FIG. 2, in accordance with some embodiments of the disclosure. In order to simplify the description, only some of the memory cells 30 of the level LV0 are shown in FIG. 4.

In FIG. 4, the memory cells 30 coupled to the same word line are arranged in the same row of the circuit. For example, the memory cells 30 coupled to the word line WL0 is arranged in the first row, and the memory cells 30 coupled to the word line WL1 is arranged in the second row. For example, the memory cells 30_10 and 30_30 are coupled to the word line WL0 and arranged in the first row, and the memory cell 30_20 is coupled to the word line WL1 and arranged in the second row. It should be noted that the arrangement in FIG. 4 of relationship between the memory cells 30 and the corresponding word lines WL0-WL4 is used as an example, and not to limit the disclosure.

Figure 5:
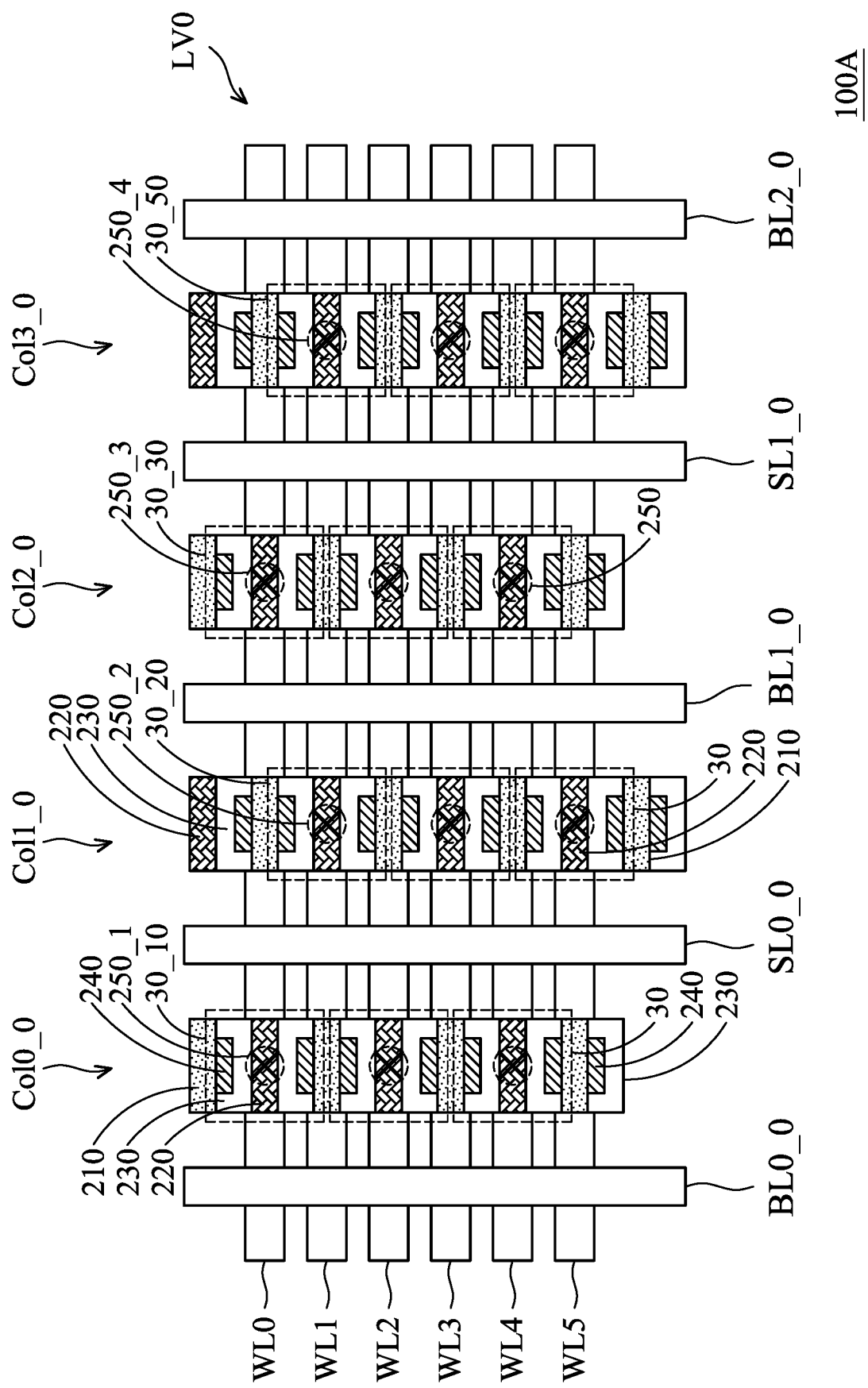
FIG. 5 shows a top view of the three-dimensional memory of FIG. 2, in accordance with some embodiments of the disclosure.

FIG. 5 shows a top view of the three-dimensional memory 100A of FIG. 2, in accordance with some embodiments of the disclosure. In order to simplify the description, only some word lines under the memory cell array and some memory cells 30 in the level LV0 of the memory cell array are shown in FIG. 5.

In the sub-columns Col0_0, Col1_0, Col2_0 and Col3_0, the memory cells 30 are shown in perspective. In each of the sub-columns Col0_0, Col1_0, Col2_0 and Col3_0, the memory cells 30 are separated from each by a dielectric layer 210. The channel 220 of the transistor MM in each memory cell 30 is wrapped by a memory film 230. A type of the three-dimensional memory 100A is determined according to the material of the memory film 230. The material of the memory film 230 includes oxide-nitride-oxide (ONO), nitride-oxide-nitride (NON), SiN, ferroelectric (FE) and so on. If the material of the memory film 230 includes ONO, the 3D memory 100A may be a NOR flash. If the material of the memory film 230 includes FE material, the 3D memory 100A may be a ferroelectric RAM.

In each memory cell 30, the memory film 230 is wrapped by a gate electrode (or metal gate) 240. For the memory cell 30, the gate electrode 240 is functioned as the gate of the transistor MM in the memory cell 30, and the gate of the transistor MM is coupled to the corresponding word line through the via 250. For example, the memory cell 30_10 of the sub-column Col0_0 is coupled to the word line WL0 through the via 250_1. The memory cell 30_20 of the sub-column Col1_0 is coupled to the word line WL1 through the via 250_2, and the memory cell 30_30 of the sub-column Col2_0 is coupled to the word line WL0 through the via 250_3. Furthermore, the memory cell 30_50 of the sub-column Col3_0 is coupled to the word line WL1 through the via 250_4.

In FIG. 5, the channels 220 of the memory cells 30_10 and 30_30 are formed over the word line WL0, and the channels 220 of the memory cells 30_20 and 30_50 are formed over the word line WL1. Therefore, the memory cells 30_10 and 30_30 are aligned with each other, and the memory cells 30_20 and 30_50 are aligned with each other. However, the memory cells 30_10 and 30_30 are not aligned with the memory cells 30_20 and 30_50. i.e., the positions of the memory cells 30_10 and 30_30 and the positions of the memory cells 30_20 and 30_50 are staggered.

In some embodiments, the channel 220 of the memory cell 30_20 in the sub-column Col1_0 is aligned with the dielectric layer 210 in the boundary of the memory cell 30_10 in sub-column Col0_0 and the dielectric layer 210 in the boundary of the memory cell 30_30 in sub-column Col2_0. Furthermore, the channel 220 of the memory cell 30_10 in the sub-column Col0_0 is aligned with the dielectric layer 210 in the boundary of the memory cell 30_20 in the sub-column Col1_0 and the channel of the memory cell 30_30 in the sub-column Col2_0.

Figure 6A:
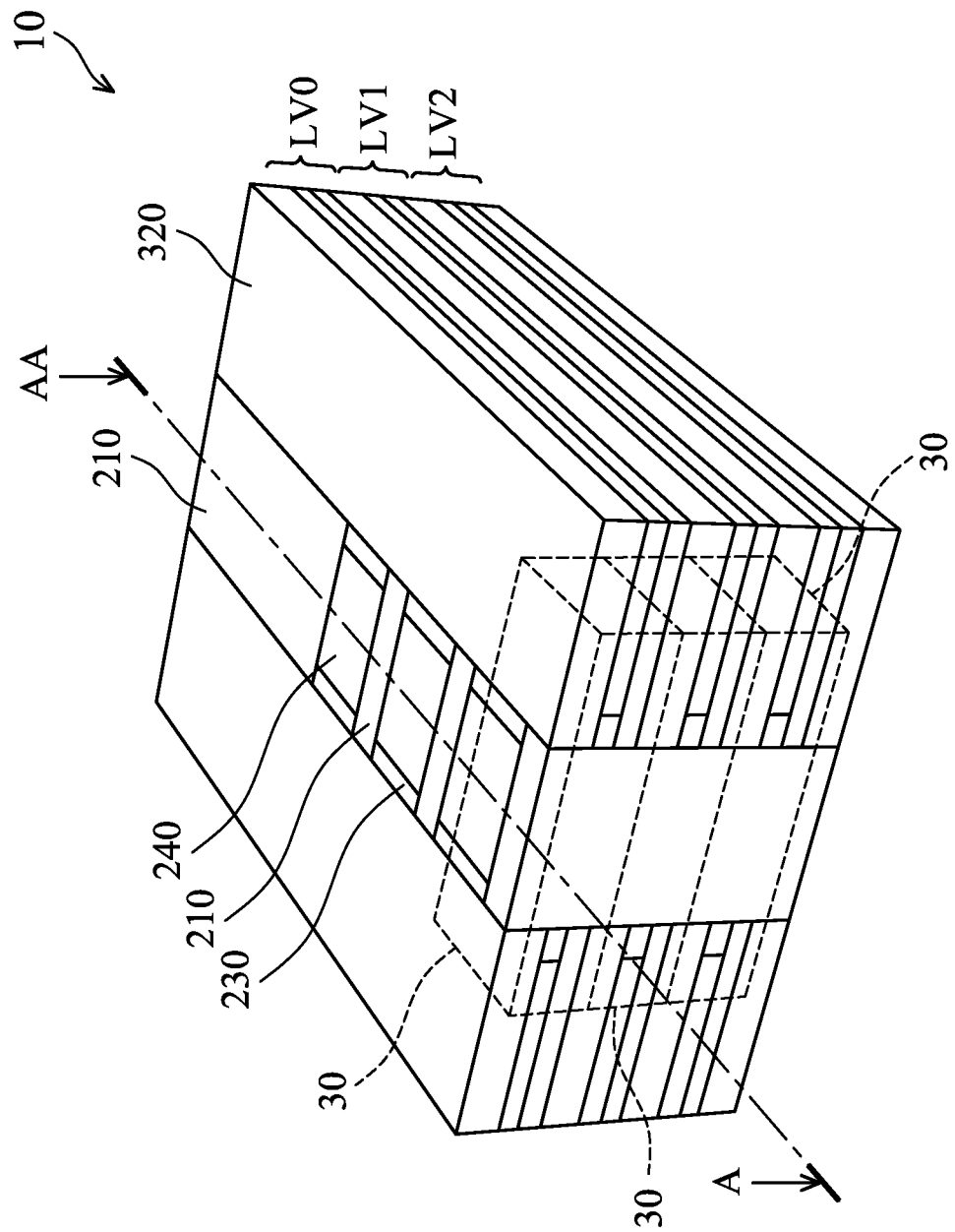
FIG. 6A shows a stereoscopic view of a column in the memory cell array, in accordance with some embodiments of the disclosure.

FIG. 6A shows a stereoscopic view of a column in the memory cell array 10, in accordance with some embodiments of the disclosure. FIG. 6B shows a top view of the memory cell array 10 of FIG. 6A, in accordance with some embodiments of the disclosure. In FIG. 6B, the memory cells 30 are shown in perspective. As described above, the memory cell array 10 includes multiple levels LV0, LV1 and LV2, and each level includes multiple memory cells 30 arranged in one sub-column of the column.

In some embodiments, the channels 220 of the transistor MM in the memory cells 30 are formed under the isolation layer 320. In some embodiments, the top surfaces of the dielectric layer 210, the memory film 230 and the gate electrode 240 are aligned with the isolation layer 320. In the same sub-column, the memory cells 30 are separated by the dielectric layer 210.

Figure 6C:
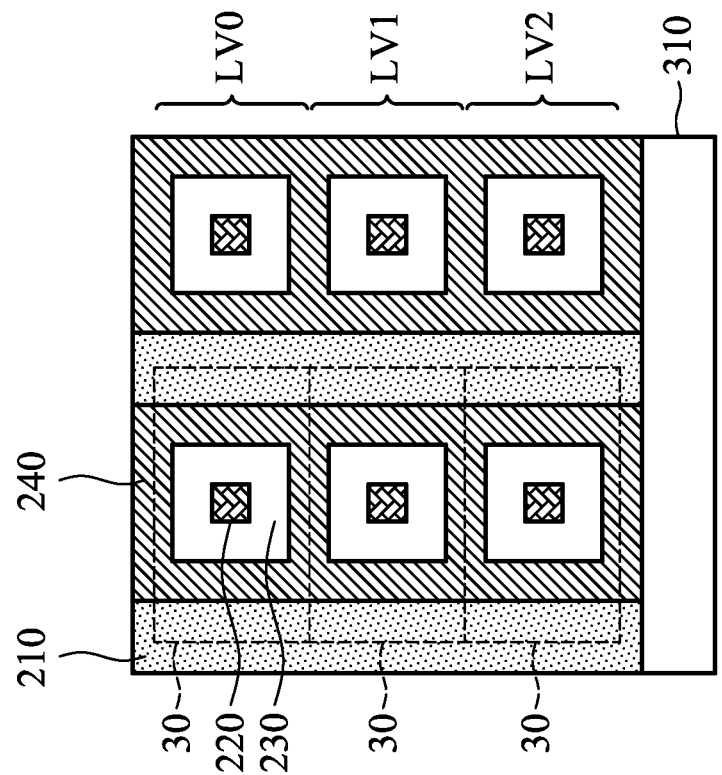
FIG. 6C shows a cross-sectional view of the memory cell array 10 along line A-AA in FIG. 6A, in accordance with some embodiments of the disclosure.
Figure 6B:
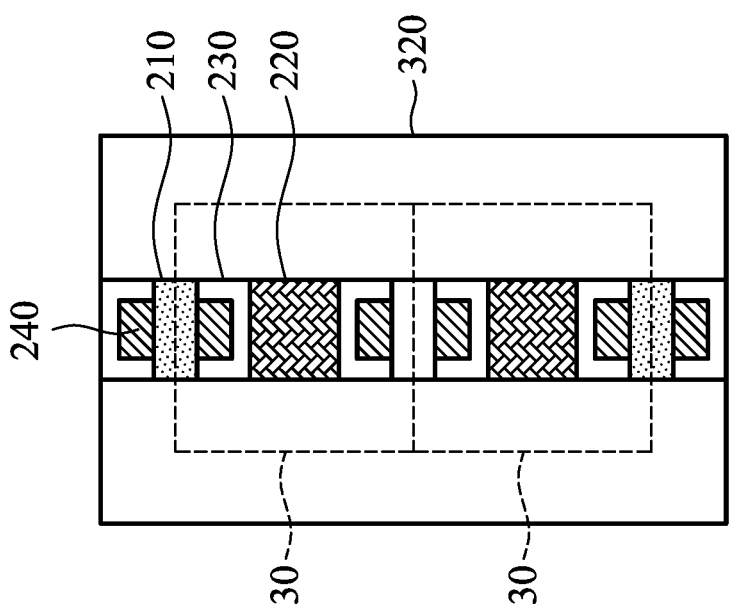
FIG. 6B shows a top view of the memory cell array of FIG. 6A, in accordance with some embodiments of the disclosure.

FIG. 6C shows a cross-sectional view of the memory cell array 10 along line A-AA in FIG. 6A, in accordance with some embodiments of the disclosure. The gate electrode 240 and the dielectric layer 210 are formed over a semiconductor substrate 310. In some embodiments, the semiconductor substrate 310 is a Si substrate. In some embodiments, the material of the semiconductor substrate 310 is selected from a group consisting of bulk-Si, SiP, SiGe, SiC, SiPC, Ge, SOI—Si, SOI—SiGe, III-VI material, and combinations thereof.

In FIG. 6C, the metal gates 240 are separated from each other by the dielectric layer 210. In some embodiments, the dielectric layer 210 may be an inter layer dielectric (ILD) layer. The dielectric layer 210 may include materials such as tetraethylorthosilicate oxide, un-doped silicate glass, or doped silicon oxide such as borophosphosilicate glass, fused silica glass, phosphosilicate glass, boron doped silicon glass, and/or other suitable dielectric materials. The dielectric layer 210 may be deposited by a PECVD process, a flowable CVD (FCVD) process, or other suitable deposition technique. In some embodiments, after the dielectric layer 210 is deposited, a CMP process is performed to planarize a top surface of the memory cell array 10. In some embodiments, the dielectric layer 210 may include multiple layers.

The channel 220 of each memory cell 30 is a nanowire or nanosheet. The memory film 230 and the gate electrode 240 wrap around each of the semiconductor layer to form the transistor channels 220 thereof. The material of the memory film 230 includes oxide-nitride-oxide (ONO), nitride-oxide-nitride (NON), SiN, ferroelectric (FE) and so on. Furthermore, a type of the memory cell array is determined according to the material of the memory film 230. In order to simplify the description, some features (e.g., spacer) in the memory cell array will be omitted.

Figure 6D:
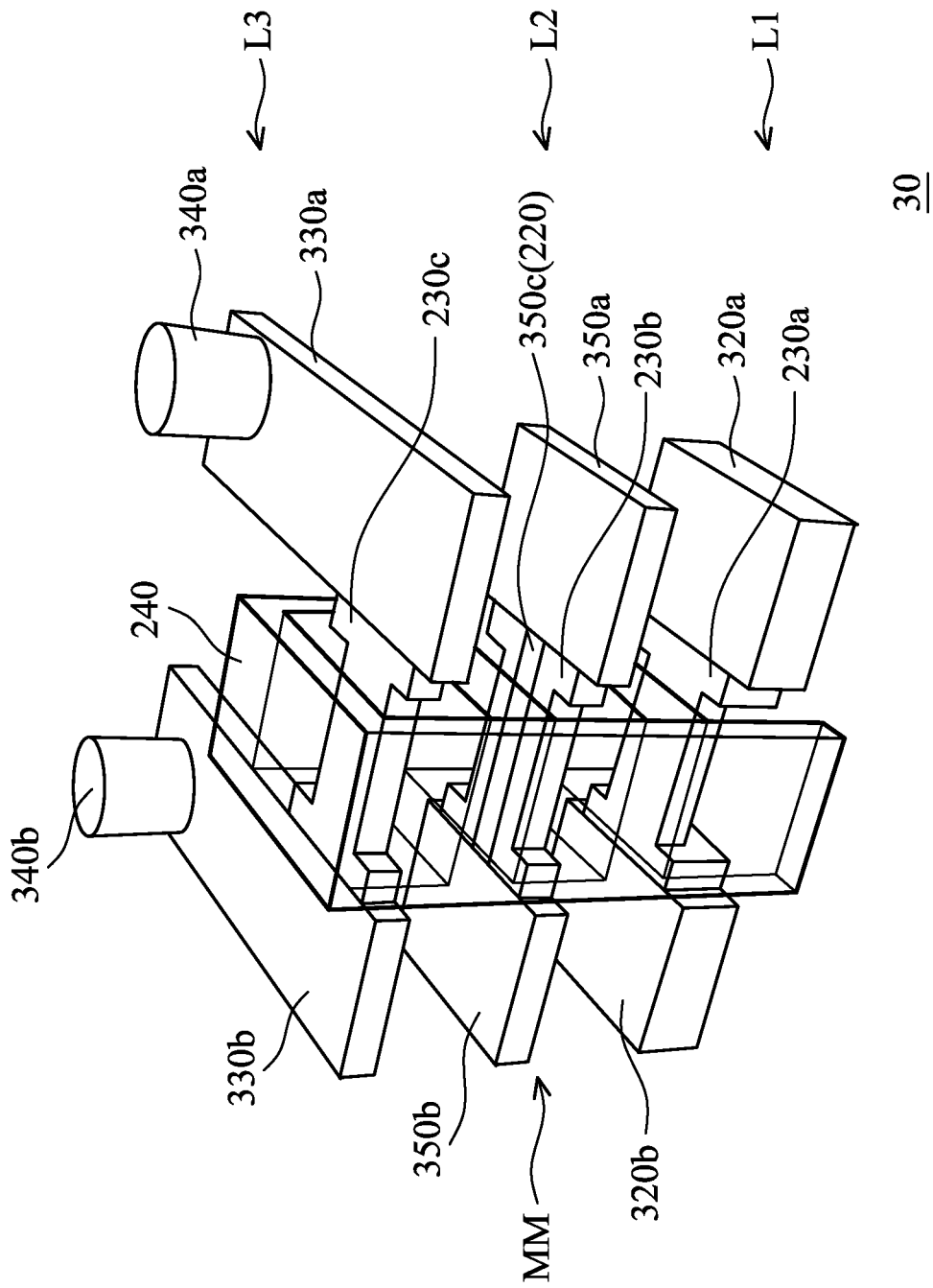
FIG. 6D shows an exploded view of single memory cell in FIG. 6A, in accordance with some embodiments of the disclosure.

FIG. 6D shows an exploded view of single memory cell 30 in FIG. 6A, in accordance with some embodiments of the disclosure. In FIG. 6D, the memory cell 30 includes three layers L1 to L3.

The layer L1 is the lower layer in the memory cell 30. In the layer L1, the isolation layer 320 is divided into the isolation regions 320a and 320b by the gate electrode 240 and the memory film 230a. The memory film 230a is wrapped by the gate electrode 240. In some embodiments, a first portion of the memory film 230a that is in contact with the isolation region 320a and a second portion of the memory film 230a that is in contact with the isolation region 320b is not wrapped by the gate electrode 240. Furthermore, the isolation regions 320a and 320b are separated from the gate electrode 240 by the memory film 230a.

The layer L2 is the middle layer in the memory cell 30. In the layer L2, a semiconductor layer is divided into the semiconductor layers 350a, 350b and 350c. The semiconductor layer 350c is disposed between the semiconductor layers 350a and 350b. The semiconductor layer 350a is the drain region of the transistor MM in the memory cell 30. The semiconductor layer 350b is the source region of the transistor MM in the memory cell 30. The semiconductor layer 350c may be a nanowire or nanosheet for the channel 220 of the transistor MM, and the semiconductor layer 350c is wrapped by the memory film 230b. The memory film 230b is wrapped by the gate electrode 240. In some embodiments, a first portion of the memory film 230b that is in contact with the semiconductor layer 350a and a second portion of the memory film 230b that is in contact with the semiconductor layer 350b are not wrapped by the gate electrode 240. Furthermore, the semiconductor layers 350a and 350b are separated from the gate electrode 240 by the memory film 230b.

In some embodiments, the source region and drain region are formed by multi-layer epitaxial growth at first. Furthermore, in each-column the source region and drain region of one cell are connect to the other memories cells in the same column and do not need extra process.

The layer L3 is the higher layer in the memory cell 30. In the layer L3, the metal lines (or electrodes) 330a and 330b of the metal layer 330 are separated by the gate electrode 240 and the memory film 230c. The metal line 330a is configured to couple the drain region (i.e. the semiconductor layer 350a) of the transistor MM to the corresponding sub-bit line through the via (or contact) 340a. The metal line 330b is configured to couple the source region (i.e. the semiconductor layer 350b) of the transistor MM to the corresponding sub-source line through the via (or contact) 340b. The memory film 230c is wrapped by the gate electrode 240. In some embodiments, a portion of the memory film 230c that is in contact with the metal lines layers 330a and 330b is not wrapped by the gate electrode 240. Furthermore, the metal lines 330a and 330b are separated from the gate electrode 240 by the memory film 230c.

Figure 7:
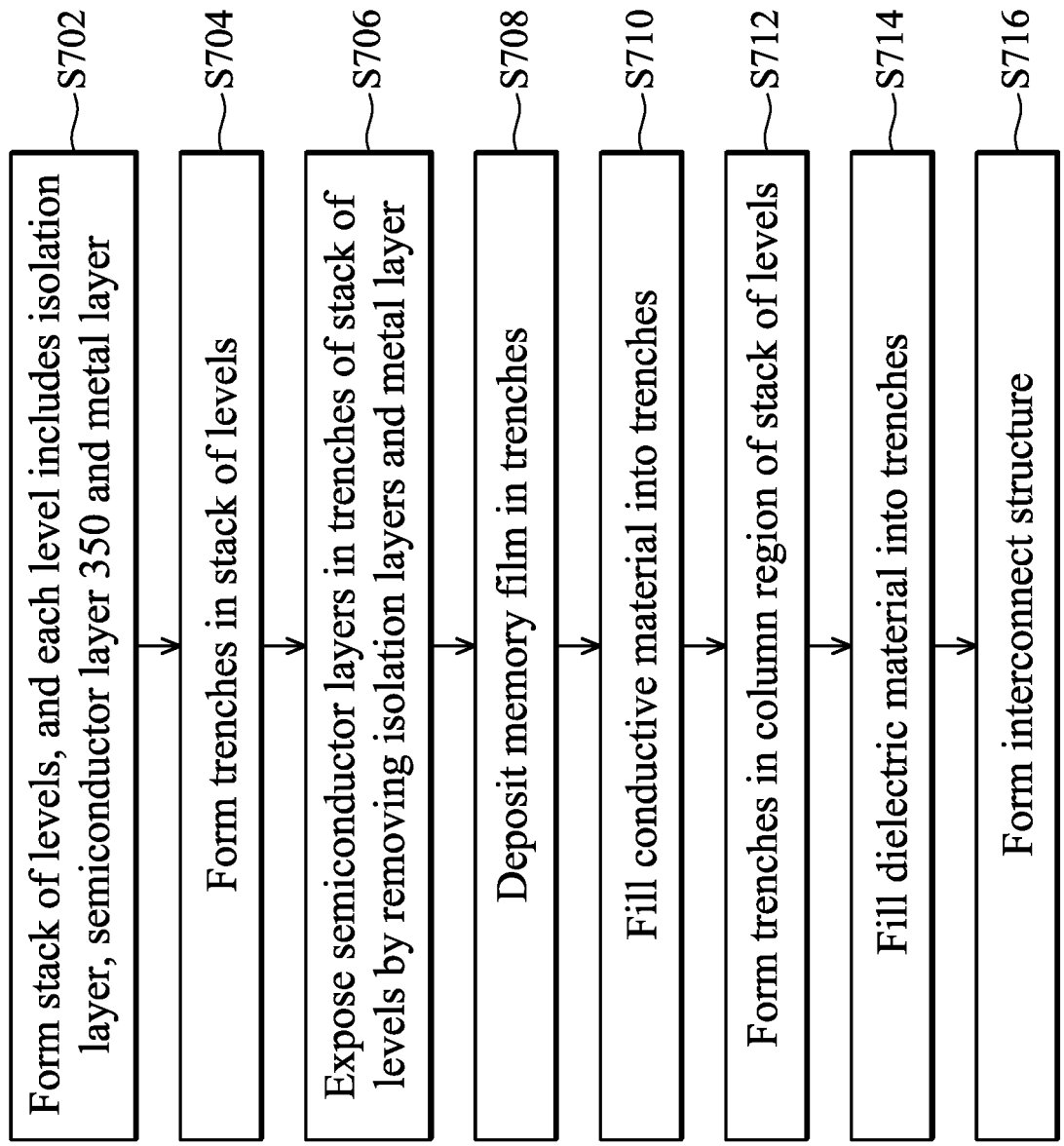
FIG. 7 illustrates a flow chart of method for fabricating the three-dimensional (3D) memory, in accordance with some embodiments of the disclosure.

FIG. 7 illustrates a flow chart of method for fabricating the three-dimensional (3D) memory 100, in accordance with some embodiments of the disclosure. The method of FIG. 7 is merely an example and is not intended to limit the present disclosure beyond what is explicitly recited in the claims. Additional operations can be provided before, during, and after the method of FIG. 7, and some operations described can be replaced, eliminated, or moved around for additional embodiments of the method. The method of FIG. 7 is described below in conjunction with FIGS. 8A-8H. In order to simplify the description, only the memory cells 30 of the sub-columns of one column are shown in FIGS. 8A-8H. Furthermore, the operations S702-S716 may include a variety of GAA processes such as deposition, epitaxy, photolithography, or etching.

Figure 8A:
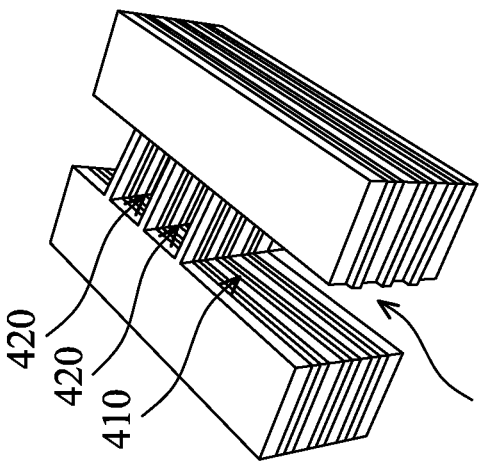

In operation S702, a stack of multiple levels (e.g., LV0-LV2) are grown over a semiconductor structure (e.g., 310 of FIG. 6C), wherein each level includes the isolation layer 320, the semiconductor layer 350 and the metal layer 330, such as shown in FIG. 8A. In some embodiments, the semiconductor layer 350 may be a silicon layer. In some embodiments, the semiconductor layer 350 may be a silicon germanium layer. In some embodiments, the semiconductor layer 350 is a middle layer disposed between the isolation layer 320 and metal layer 330. In some embodiments, the metal layer 330 is the higher layer and the isolation layer 320 is the lower layer. In some embodiments, the metal layer 330 is the lower layer and the isolation layer 320 is the higher layer.

Figure 8B:
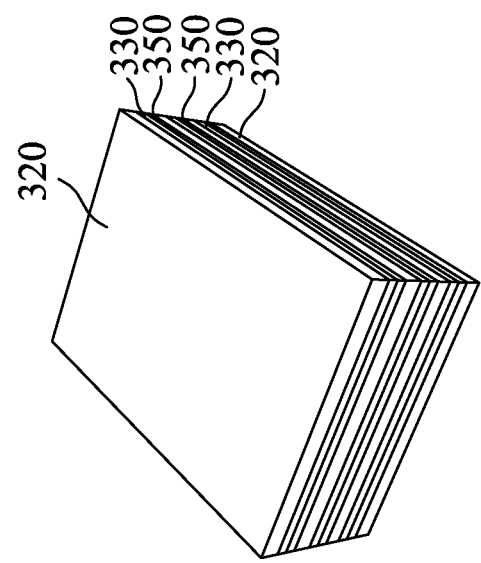

In operation S704, multiple trenches 410 and 420 are formed in the stack of levels, such as shown in FIG. 8B. In some embodiments, a masking element is formed over the stack of levels through a photolithography process, so as to expose the column region 430. Subsequently, the stack of levels are etched through the masking element to form trenches 410 and 420 therein. In some embodiments, the number of the trench 410 is one, and the number of the trench 420 is multiple. Furthermore, the trenches 420 have the same area, and the area of the trench 410 is greater than the area of the trench 420. The portion of the stack of levels between the trenches 410 and 420 in the column region 430 become the active regions.

Figure 8D:
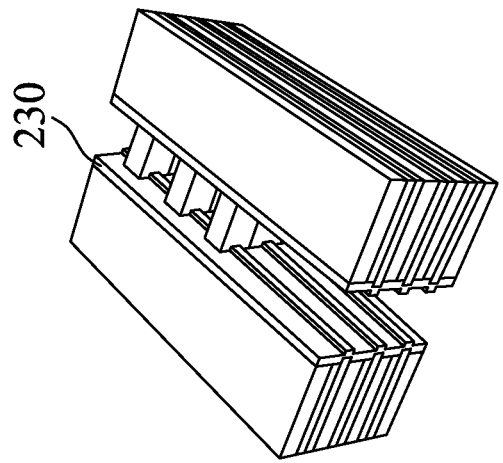
Figure 8C:
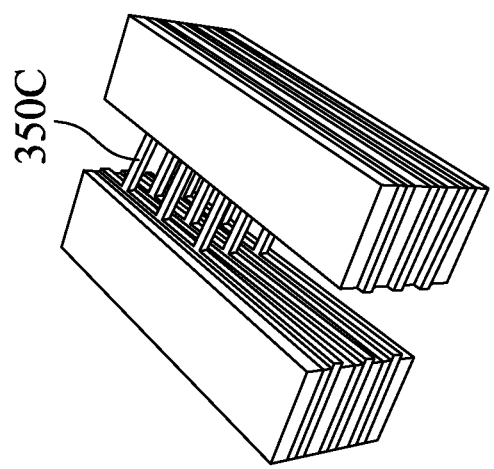

In operation S706, multiple semiconductor layers 350c (i.e., nanowire or nanosheet) are exposed in the stack of levels, such as shown in FIG. 8C. In some embodiments, a masking element is formed over the stack of levels through a photolithography process to expose the active regions and the trenches 410 and 420. Subsequently, the active regions are etched through the masking element to remove the isolation layers 320 and the metal layers 330 therein. Thus, the semiconductor layers 350c are completely exposed.

In operation S708, a memory film 230 is deposited in the trenches 410 and 420 and to wrap around the semiconductor layers 350c, such as shown in FIG. 8D. The material of the memory film 230 includes oxide-nitride-oxide (ONO), nitride-oxide-nitride (NON), SiN, ferroelectric (FE) and so on. Furthermore, a type of the memory cell 30 is determined according to the material of the memory film 230.

In operation S710, a conductive material is filled into the trenches 410 and 420 to form the gate electrode 240, such as shown in FIG. 8E. In some embodiments, after the conductive material is filled, a CMP process is performed to planarize a top surface of the memory cell array. Thus, the top surface of the memory film 230 is aligned with (or leveled with) the gate electrode 240. Furthermore, the memory film 230 and the gate electrode 240 wrap around each of the semiconductor layers 350c to form transistor channels 220 thereof.

In operation S712, multiple trenches 440 and 450 are formed in the column region 430 of the stack of levels, such as shown in FIG. 8F. In some embodiments, a masking element is formed over the stack of levels through a photolithography process, so as to expose the column region 430. Subsequently, the stack of levels are etched through the masking element to form the trenches 440 and 450 therein. Furthermore, the gate electrode 240 is divided into multiple segments by the trenches 450. In some embodiments, the number of the trench 440 is one, and the number of the trench 450 is multiple. Furthermore, the area of the trench 440 is greater than the area of the trench 440. The portion of the stack of levels between the trenches 450 and 450 and between the trenches 440 and 450 in the device region 430 become a cell region.

In operation S714, a dielectric material is filled into the trenches 440 and 450 to form the dielectric layer 210, such as shown in FIG. 8G. In the cell region, the memory cells 30 in the same layer are separated from each other by the dielectric layer 210. Furthermore, the gate electrodes 240 are separated from each other by the dielectric layer 210. In the operation S714, the memory cell array 10 is formed.

In operation S716, the interconnect structure 15 is formed, such as shown in FIG. 8H. A portion of the stack of levels, the dielectric layer 210 and the memory film 230 are removed and then multiple vias (or contacts) are formed, so as to form the interconnect structure 15. In some embodiments, a masking element is formed over the stack of levels through a photolithography process, so as to expose a region 472. Subsequently, the stack of levels are etched through the masking element, so as to expose the metal layer 330 of the memory cells 30 in the level LV2. In the metal layer 330 of the level LV2, the metal line 330_1 and the metal line 330_2 are separated by the dielectric layer 210 and the memory film 230. Furthermore, the metal line 330_1 (e.g., the metal line 330a in FIG. 6D) is configured to connect the drain region of the transistor MM of each memory cell 30 in the level LV2 to the sub-bit line BL_2 through the corresponding via (e.g., the via 340a in FIG. 6D). The metal line 330_2 (e.g., the metal line 330b in FIG. 6D) is configured to connect the source region of the transistor MM of each memory cell 30 in the level LV2 to the sub-source line SL_2 through the corresponding via (e.g., the via 340b in FIG. 6D).

In some embodiments, a masking element is formed over the stack of levels through a photolithography process, so as to expose a region 474. Subsequently, the stack of levels are etched through the masking element, so as to expose the metal layer 330 of the memory cells 30 in the level LV1. In the metal layer 330 of the level LV1, the metal line 330_3 and the metal line 330_4 are separated by the dielectric layer 210 and the memory film 230. Furthermore, the metal line 330_3 is configured to connect the drain region of the transistor MM of each memory cell 30 in the level LV1 to the sub-bit line BL_1 through the corresponding via. The metal line 330_4 is configured to connect the source region of the transistor MM of each memory cell 30 in the level LV1 to the sub-source line SL_1 through the corresponding via.

In some embodiments, a masking element is formed over the stack of levels through a photolithography process, so as to expose a region 476. Subsequently, the stack of levels are etched through the masking element, so as to expose the metal layer 330 of the memory cells 30 in the level LV0. In the metal layer 330 of the level LV0, the metal line 330_5 and the metal line 330_6 are separated by the dielectric layer 210 and the memory film 230. Furthermore, the metal line 330_5 is configured to connect the drain region of the transistor MM of each memory cell 30 in the level LV0 to the sub-bit line BL_0 through the corresponding via. The metal line 330_6 is configured to connect the source region of the transistor MM of each memory cell 30 in the level LV0 to the sub-source line SL_0 through the corresponding via.

Embodiments of three-dimensional memories for high density memory are provided. The three-dimensional memory is NOR memory including a memory cell array with multiple level stacked, and each level includes multiple memory cells 30. The memory cell may include a GAA nanowire or nanosheet transistor. In each level, the memory cells are arranged in multiple parallel lines. The positions of memory cells 30 in the parallel lines are staggered. In the two adjacent parallel lines, the memory cells may share the same bit line or the same source line. The gate electrode in the transistors of the memory cells coupled to the same word line are formed in different levels. Furthermore, by charging material of the memory film 230, the type of the three-dimensional memory is determined.

In some embodiments, a three-dimensional memory is provided. The three-dimensional memory includes a plurality of memory cells, a plurality of word lines, a plurality of bit lines and a plurality of source lines. The memory cells are divided into a plurality of groups, and the groups of memory cells are formed in respective levels stacked along a first direction. The word lines extend along a second direction, and the second direction is perpendicular to the first direction. Each of the bit lines includes a plurality of sub-bit lines formed in the respective levels. Each of the source lines includes a plurality of sub-source lines formed in respective levels. In each of the levels, the memory cells of the corresponding group are arranged in a plurality of columns, and the sub-bit lines and the sub-source lines are alternately arranged between two adjacent columns.

In some embodiments, a three-dimensional memory is provided. The three-dimensional memory includes a memory cell array. The memory cell array includes a plurality of levels stacked along a first direction, and a plurality of memory cells are formed in a plurality of lines in each of the levels. Each of the memory cells includes a transistor. The transistor includes a first isolation region and a second isolation region formed in a lower layer of the level, a drain region and a source region formed in a middle layer of the level, a first electrode and a second electrode formed in a higher layer of the level and a gate electrode formed between the source region and drain region. The first isolation region is separated from the second isolation region by a first memory film in the lower layer. The drain region is separated from the source region by a second memory film in the middle layer, and a channel between the drain region and source region is wrapped by the second memory film. The first electrode is separated from the second electrode by a third memory film in the higher layer. The first, second, and third memory films are wrapped by the metal gate.

In some embodiments, a method for fabricating a three-dimensional (3D) memory is provided. A stack with multiple levels is formed, and each of the levels includes an isolation layer, a metal layer, and a semiconductor layer between the isolation layer and the metal layer. A first trench and a plurality of second trenches are formed along each parallel line in the stack of the levels. The isolation layers and the metal layers in the parallel lines are removed through the first trench and the second trenches, so as to expose the semiconductor layers in the parallel line. A plurality of memory cells are formed in the parallel lines of the levels, wherein in each of the levels, each of the memory cells includes a transistor and a channel of the transistor is formed by the semiconductor layer in the parallel line.

The foregoing outlines nodes of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A three-dimensional memory, comprising:
a plurality of memory cells arranged in a plurality of levels stacked in a first direction, and divided into a plurality of groups, wherein each of the groups of the memory cells is formed in respective level of the levels;
a plurality of word lines extending along a second direction and formed in the same level under the memory cells, wherein the second direction is perpendicular to the first direction;
a plurality of bit lines, wherein each of the bit lines comprises a plurality of sub-bit lines formed in the levels; and
a plurality of source lines, wherein each of the source lines comprises a plurality of sub-source lines formed in the levels,
wherein in each of the levels, the memory cells of the corresponding group are arranged in a plurality of columns, and the sub-bit lines and the sub-source lines are alternately arranged between the columns.

2. The three-dimensional memory as claimed in claim 1, wherein the memory cells of two adjacent columns are coupled to the different word lines.

3. The three-dimensional memory as claimed in claim 1, wherein the memory cells of odd columns are aligned with each other, and the memory cells of even columns are aligned with each other.

4. The three-dimensional memory as claimed in claim 1, wherein the memory cells of odd columns are not aligned with the memory cells of even columns.

5. The three-dimensional memory as claimed in claim 1, wherein the memory cells coupled to the same word line are disposed in the different levels.

6. The three-dimensional memory as claimed in claim 1, wherein the bit lines and the source lines extend along a third direction, and the third direction is perpendicular to the first direction and the second direction.

7. The three-dimensional memory as claimed in claim 1, wherein the memory cells coupled to the same sub-bit line or the same sub-source line are disposed in the same levels.

8. The three-dimensional memory as claimed in claim 1, wherein each of the memory cells comprises a transistor coupled between the corresponding sub-bit line and the corresponding sub-source line, and a gate of the transistor is coupled to the corresponding word line.

9. The three-dimensional memory as claimed in claim 8, wherein the transistor is a gate-all-around (GAA) nanowire or nanosheet transistor, and a memory file wraps around a channel of the transistor.

10. A three-dimensional memory, comprising:
a memory cell array comprising a plurality of levels stacked in a first direction, wherein a plurality of memory cells are formed in a plurality of lines in each of the levels, wherein each of the memory cells comprises a transistor, and the transistor comprises:
a first isolation region and a second isolation region formed in a lower layer of the level, wherein the first isolation region is separated from the second isolation region by a first memory film in the lower layer;
a drain region and a source region formed in a middle layer of the level, wherein the drain region is separated from the source region by a second memory film in the middle layer, and a channel between the drain region and source region is wrapped by the second memory film;
a first electrode and a second electrode formed in a higher layer of the level, wherein the first electrode is separated from the second electrode by a third memory film in the higher layer; and
a gate electrode formed between the source region and drain region, wherein the first, second, and third memory films are wrapped by the gate electrode,
wherein the channels and the gate electrodes of the transistors in the memory cells of two adjacent lines in the same level are staggered.

11. The three-dimensional memory as claimed in claim 10, further comprising:
a plurality of word lines under, over, or within the memory cell array and extending along a second direction that is perpendicular to the first direction,
wherein the word lines are perpendicular to the memory cells arranged in the lines.

12. The three-dimensional memory as claimed in claim 11, wherein the gate electrode in the transistors of the memory cells coupled to the same word line are formed in the different levels.

13. The three-dimensional memory as claimed in claim 10, further comprising:
a plurality of word lines extending along a second direction that is perpendicular to the first direction,
wherein each of the word lines is coupled to the memory cells in the different levels through the same gate electrode.

14. The three-dimensional memory as claimed in claim 13, wherein the transistors of the memory cells coupled to the same word line share the same gate electrode.

15. The three-dimensional memory as claimed in claim 10, wherein the first electrode is formed over the drain region of the transistor and coupled the drain region of the transistor to a bit line, and the second electrode is formed over the source region of the transistor and coupled the source region of the transistor to a source line, wherein the bit line is parallel with the source line.

16. The three-dimensional memory as claimed in claim 10, wherein the first, second, and third memory films are formed of the same material, and the drain region, the source region, and the channel are formed of the same material.

17. A three-dimensional memory, comprising:
a plurality of memory cells arranged in a plurality of levels stacked in a first direction, and divided into a plurality of groups, wherein each of the groups of the memory cells is formed in respective level of the levels;
a plurality of bit lines, wherein each of the bit lines comprises a plurality of sub-bit lines, and each of the sub-bit lines is formed in respective level of the levels;
a plurality of source lines, wherein each of the source lines comprises a plurality of sub-source lines, and each of the sub-source lines is formed in respective level of the levels; and
a plurality of word lines extending along a second direction and formed in the same layer different from the levels, wherein top surfaces of the word lines are lower than the memory cells, the sub-bit lines, and the sub-source lines, wherein the second direction is perpendicular to the first direction,
wherein in each of the levels, the memory cells of the corresponding group are arranged in a plurality of columns, and the sub-bit lines and the sub-source lines are alternately arranged and separated from each other by the memory cells of the columns.

18. The three-dimensional memory as claimed in claim 17, wherein the memory cells of two adjacent columns are coupled to the different word lines.

19. The three-dimensional memory as claimed in claim 17, wherein the memory cells of odd columns are aligned with each other, and the memory cells of even columns are aligned with each other.

20. The three-dimensional memory as claimed in claim 17, wherein the memory cells coupled to the same word line are disposed in the different levels.

\* \* \* \* \*